AMPLIFIER PROTECTIVE CIRCUIT
Filed Sept. 14, 1954
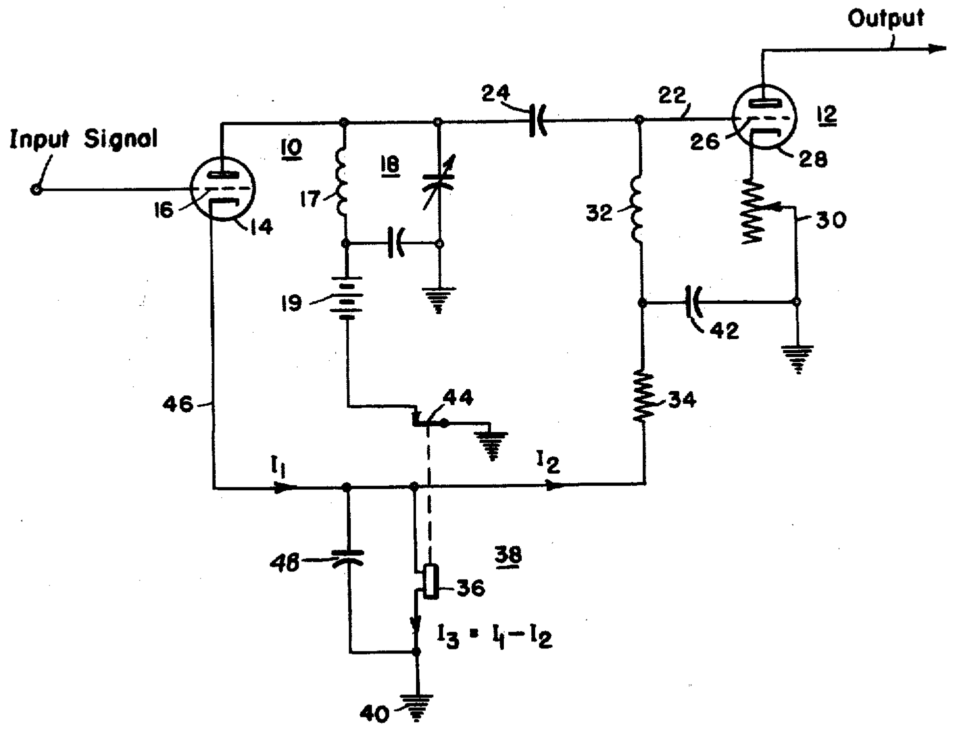
WITNESSES:
E. A. McCloskey.
J. H. Murray
INVENTORS
Thomas E. Frame
and James R. Heck.
BY
F. E. Browder
ATTORNEY United States Patent Office 2,858,378 Patented Oct. 28, 1958

2,858,378

AMPLIFIER PROTECTIVE CIRCUIT

Thomas E. Frame, Glen Burnie, and James R. Heck, Catonsville, Md., assignors to Westinghouse Electric Corporation, East Pittsburgh, Pa., a corporation of Pennsylvania Application September 14, 1954, Serial No. 455,974

1 Claim. (Cl. 179—171)

This invention relates to tuned amplifier circuits and more particularly to means for preventing an overcurrent condition in a tuned amplifier circuit.

In a tuned amplifier stage of the type employing a parallel resonant tank circuit, the space current through the amplifier tube increases progressively as the tank circuit becomes detuned. In this type of amplifier the total available plate voltage is divided between the tank circuit and the amplifier tube, assuming that no external load is connected to the system. As the tank circuit becomes detuned with no external load added, its impedance drops, thereby decreasing its voltage drop and increasing the voltage drop across the amplifier tube. The impedance of the amplifier tube is relatively low with respect to that of a tuned tank circuit; and, therefore, the detuned tank circuit will cause greatly increased plate current in the amplifier tube. Due to the fact that the impedance of the unloaded tank circuit is greatly reduced when off-resonance (detuned), by far the greater part of the input power to the stage will be applied to the amplifier tube and will appear as dissipated heat in the tube. Since the amplifier tube is rated for a maximum amount of heat dissipation, some means must be provided to remove or reduce anode voltage to prevent exceeding maximum allowable dissipation. Otherwise, the tube will be destroyed by excessive heat.

If the tuned amplifier circuit is connected to an external load as, for example, a following amplifying stage, the heat dissipation in the tube will rise with detuning as it did in the unloaded condition, but now the maximum allowable plate current is increased. This is a result of the fact that the voltage across the tube is now decreased and the total available power (supply voltage multiplied by the plate current) is divided between the amplifier tube and the external circuit.

Heretofore, it has been common to connect a simple overcurrent relay to the plate or cathode circuit of the amplifier tube to prevent overcurrent. The relay is set to trip when the current through the tube reaches a predetermined maximum value. However, the maximum allowable plate current varies between the loaded and unloaded conditions of the amplifier; and, consequently, the relay must be set for a loaded or unloaded condition. If the relay is set for an unloaded condition, it will trip when a load is added even though the amplifier tube plate dissipation would not be excessive under this loaded condition. On the other hand, if the relay is set for the loaded condition, the amplifier tube may be damaged by excessive current when no load is present.

The present invention provides a means for preventing excessive plate dissipation in a tuned amplifier circuit for both loaded and unloaded conditions.

In accordance with the invention, the cathode of the tuned amplifier stage is connected to the negative side of the anode voltage supply through a relay. Means are provided in connection with the external load of the amplifier for obtaining a control current which increases as the magnitude of the load increases. The control current is also passed through the aforementioned relay in a manner such that the current through the relay is equal to the difference between the cathode current and the control current. When the value of the difference between cathode and control current reaches a predetermined magnitude, the relay trips and breaks the plate circuit of the amplifier tube. Since the effective current for tripping the relay decreases as the external load increases, provision is thereby made to allow the plate current in the loaded amplifier to increase above the allowable value dictated by the unloaded condition of the amplifier.

In the present embodiment of the invention, disclosed herein, the external load for the amplifier tube constitutes a succeeding stage in a cascaded amplifier system. The control voltage referred to above constitutes the grid current of the succeeding stage which increases as the plate current (load) in the succeeding stage increases. It is to be understood, however, that the invention is not limited to the case where the external load constitutes a succeeding amplifier stage but may be used with any load in combination with means for producing an increasing current as the load increases. It should also be understood that although the following description concerns a triode amplifier, the principles disclosed are equally applicable to tetrode, pentode, or other multi-element amplifier tubes.

Other objects and features of the invention will become apparent from the following description taken in connection with the accompanying single figure drawing which illustrates the invention schematically.

Referring to the drawing, the amplifier circuit shown therein includes a driving stage 10 and a driven stage 12 which is operated class C in the present embodiment. Driving stage 10 comprises a triode electron discharge tube 14 having its grid 16 connected to a source of radio frequency energy, not shown. Included in the plate circuit of triode 14 is a tunable tank circuit 18 which, in effect, constitutes a parallel resonant circuit.

In operation, the plate current through tube 14 has both direct and alternating components. The direct current component passes through inductance 17 of tank circuit 18 to the positive side of a D. C. voltage source 19. The low potential side of tank circuit 18 is connected through path 22 and coupling condenser 24 to the grid 26 of triode discharge tube 28 in driven stage 12. Condenser 24 will block out the direct current component of the voltage in the plate circuit of tube 10 but will permit the alternating component to reach grid 26 to thereby control current flow through tube 28. The direct current potential on the cathode of tube 28 may be controlled by varying an adjustable biasing means 30. Although a variable resistor is shown as the biasing means in the present embodiment, any suitable bias source may be used without materially affecting the operation of the invention.

The grid circuit of tube 28 passes from grid 26, through choke coil 32, grid leak resistor 34, the solenoid 36 of overcurrent relay 38 and ground point 40. Coil 32 and condenser 42 serve to filter out radio frequency energy appearing in the grid circuit of tube 28, thereby preventing it from passing through solenoid 36. In this respect, choke coil 32 acts as a high impedance to R. F. energy and condenser 42 acts as a low impedance to bypass R. F. energy to ground.

Grid current (indicated as $I_2$) will flow through tube 28 whenever the grid 26 becomes positive with respect to the cathode. Since the voltage impressed on grid 26 is A. C. and since tube 12 is operated class C, grid current can flow during one half cycle at most. The cycles, however, are of such frequency that the current $I_2$ will appear as a more or less steady D. C. When the $I_2$ grid current from tube 28 flows through solenoid 36, it tends to deenergize the same and close contact points 44.

The cathode of tube 14 is also connected to ground point 40 through path 46 and solenoid 36. The D. C. cathode current (indicated as $I_1$) opposes $I_2$ grid current and tends to energize solenoid 36 to open contact points 44. The current through solenoid 36 (indicated as $I_3$) is, therefore, equal to the difference between $I_1$ and $I_2$. In this respect it is apparent that contact points 44 will be open or closed depending upon the relative magnitudes of $I_1$ and $I_2$. Capacitor 48 serves to by-pass alternating currents and prevents them from passing through solenoid 36.

With the circuit described above, an overcurrent condition in tube 14 is prevented for a wide range of load conditions in the plate circuit of tube 14. Consider, first, an unloaded condition such as might be possible should the heating filaments in tube 28 go off. It is assumed that tank circuit 18 is now tuned to resonance. No grid current $I_2$ will now flow, and the current $I_3$ will be equal to $I_1$. When $I_1$ reaches the maximum value permitted by the dissipation rating of tube 14, overcurrent relay 38 is set to trip, thereby opening contact points 44 and breaking the plate circuit of tube 14.

If tube 28 operates, a load is added to the plate circuit of tube 14. Assuming, now, that tank circuit 18 is tuned to resonance with the load added, cathode current $I_1$ will increase, but at the same time $I_2$ grid current will increase also. This action may or may not increase $I_3$, depending upon whether $I_1$ or $I_2$ is greater. $I_3$ may actually decrease if under normal loaded operating conditions $I_2$ exceeds $I_1$. Under loaded conditions, relay 38 is still set to trip when $I_3$ reaches the maximum current value permitted by the unloaded dissipation rating of tube 14. Remembering that the permissible current through tube 14 increases as the load increases, it can be seen that $I_1$ can now meet this increased maximum value without tripping relay 38 since $I_2$ is increasing also at this time.

Now consider the action when tank circuit 18 is detuned and a load is applied (i. e., tube 28 is conducting). Since the tank circuit is a parallel resonant circuit, its impedance will drop with detuning. Therefore, the plate current through tube 14 will increase above its value established when the tank circuit is tuned. At the same time, the grid current of tube 28 decreases since the voltage applied to grid 26 drops in accordance with the drop in impedance across tank circuit 18. An $I_1$ increase and an $I_2$ decrease both add to increase $I_3$ current through relay 38 until a point is reached where it trips. For example, if under normal conditions $I_1$ and $I_2$ are both 250 milliamperes, the net current through relay 38 would be zero. Now, if tank circuit 18 is detuned to increase $I_1$ to 300 milliamperes, the current increase through relay 38 due to this effect is 50 milliamperes. If, at the same time, the grid current $I_2$ has dropped to 200 milliamperes, the total current $I_3$ through relay 38 becomes 100 milliamperes. After $I_3$ reaches a predetermined maximum value by this process, relay 38 will trip and break the plate circuit of tube 14 to prevent an overcurrent condition.

In the case where an arc-over from grid 26 to ground occurs, protection of tube 14 is afforded since the grid current $I_2$ through tube 28 would be cut off and the plate current $I_1$ of tube 14 would increase to trip relay 38. A grid-to-cathode short in tube 28 would also trip relay 38 due to a decrease and increase in $I_2$ and $I_1$ respectively.

Although this invention has been described in connection with a specific embodiment, it will be understood by those skilled in the art that various changes in form and arrangement of parts can be made to suit requirements without departing from the spirit and scope of the invention.

We claim as our invention:

In combination, a first electron discharge device having an anode and cathode included therein, a second electron discharge device having a cathode and control grid included therein, a relay device provided with an energizing coil having one terminal connected through direct current paths to the cathode and control electrode of the first and second discharge devices respectively and its other terminal connected to a point of reference potential, a parallel resonant circuit connected between the anode of said first discharge device and said point of reference potential, a source of anode voltage having one terminal connected to the anode of said first discharge device, and a normally closed contact for said relay to connect the other terminal of the anode voltage source to said point of reference potential, the arrangement being such that the relay will be energized to open said normally closed contact when the difference between the direct cathode current of the first discharge device and the direct grid current of the second discharge device reaches a predetermined magnitude.

References Cited in the file of this patent

UNITED STATES PATENTS

| | | |
|---|---|---|
| 1,934,525 | Davis | Nov. 7, 1933 |
| 2,066,522 | Doherty | Jan. 5, 1937 |
| 2,504,699 | Kluender | Apr. 18, 1950 |